US007773358B2

(12) United States Patent
Neesgaard et al.

(10) Patent No.: US 7,773,358 B2
(45) Date of Patent: Aug. 10, 2010

(54) OUTPUT CURRENT CONTROL AND OVERLOAD PROTECTION IN DIGITAL AUDIO AMPLIFIERS

(75) Inventors: Claus Niels Neesgaard, Plano, TX (US); Lars Risbo, København (DK); Anker Bjørn-Josefsen, Lynge (DK)

(73) Assignee: Texas Instruments Incorporated, Dallas, TX (US)

( * ) Notice: Subject to any disclaimer, the term of this patent is extended or adjusted under 35 U.S.C. 154(b) by 281 days.

(21) Appl. No.: 11/335,028

(22) Filed: Jan. 19, 2006

(65) Prior Publication Data

US 2006/0262473 A1 Nov. 23, 2006

Related U.S. Application Data

(60) Provisional application No. 60/682,286, filed on May 18, 2005.

(51) Int. Cl.
*H02H 3/08* (2006.01)
(52) U.S. Cl. ................ 361/93.1; 361/18; 361/93.2; 361/93.9
(58) Field of Classification Search ............... 361/93.1, 361/18, 93.2, 93.9
See application file for complete search history.

(56) References Cited

U.S. PATENT DOCUMENTS

| 3,995,218 | A | * | 11/1976 | Moriya et al. ............... 375/249 |
| 5,828,558 | A | * | 10/1998 | Korcharz et al. .............. 363/20 |
| 5,892,665 | A | | 4/1999 | Matsumoto et al. |
| 6,359,795 | B1 | * | 3/2002 | Amantea et al. ......... 363/21.01 |
| 6,922,100 | B2 | * | 7/2005 | Midya et al. .................. 330/10 |
| 7,154,308 | B2 | * | 12/2006 | Ho ............................. 327/108 |
| 7,411,374 | B2 | * | 8/2008 | Tan et al. ..................... 320/166 |
| 2002/0105767 | A1 | * | 8/2002 | Schuellein et al. ......... 361/93.1 |
| 2005/0083115 | A1 | * | 4/2005 | Risbo .......................... 330/10 |

OTHER PUBLICATIONS

Pulse Width Modulator; Aug. 1, 1982. IBM Technical Disclosure Bulletin, vol. 25 Issue 3A. pp. 1057-1058.*
Brotton, "Sound advice for Class D amplifiers", EDN (Apr. 28, 2005), pp. 65-70.
Berkhout, "Integrated Overcurrent Protection for Class D Power Stages", 29th European Solid-State Circuits Conference: ESSCIRC 2003 (Sep. 2003), Paper C30.2.
"TK2150: Stereo 200W (6 ohm) Class-T Digital Audio Amplifier Driver Using Digital Power Processing (TM) Technology" (Tripath Technology, Inc., 2003).

\* cited by examiner

*Primary Examiner*—Jared J Fureman
*Assistant Examiner*—Christopher J Clark
(74) *Attorney, Agent, or Firm*—John J. Patti; Wade J. Brady, III; Frederick J. Telecky, Jr.

(57) ABSTRACT

Overcurrent and overload protection for the power output of a pulse-width-modulated digital audio system is disclosed. The overcurrent protection circuitry includes a latch that is set in responsive to output current from the power output stage that exceeds an overcurrent threshold; the output of the latch gates the pulse-width-modulated control signal to block power output for the remainder of the current pulse-width-modulated cycle; upon the end of the cycle, or the beginning of the next, the latch is cleared to enable power output in that next cycle. Overload protection is provided by circuitry including counters for counting the relative number of overcurrent cycles to normal, non-overcurrent cycles, and generating an overload signal to block power output in the event of too frequent overcurrent cycles.

20 Claims, 3 Drawing Sheets

OUTPUT CURRENT CONTROL AND OVERLOAD PROTECTION IN DIGITAL AUDIO AMPLIFIERS

CROSS-REFERENCE TO RELATED APPLICATIONS

This application claims priority, under 35 U.S.C. §119(e), of Provisional Application No. 60/682,286, filed May 18, 2005.

STATEMENT REGARDING FEDERALLY SPONSORED RESEARCH OR DEVELOPMENT

Not applicable.

BACKGROUND OF THE INVENTION

This invention is in the field of digital audio amplifiers, and is more specifically directed to overload protection at the output of digital audio amplifiers.

In recent years, digital signal processing techniques have become prevalent in many electronic systems. Tremendous increases in the switching speed of digital circuits have enabled digital signal processing to replace, in large part, analog circuits in many applications. For example, the sampling rates of modern digital signal processing are sufficiently fast that digital techniques have become widely implemented in audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, as well as in small form factor systems such as flat-panel LCD and plasma televisions, and DVD receivers. The ability to realize the audio output amplifier in CMOS has also enabled integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

As is well known in the art, it is important to provide overload protection at the output of power amplifiers in order to spare the amplifier outputs from overcurrent conditions, such as inadvertent short circuits due to misuse, misinstallation, or speaker failure. In conventional digital (class D) audio amplifier systems, the current from the output amplifier is monitored and, if the output current exceeds a certain limit, the power stage FET drivers are turned off. The audio amplifier typically must be reset, or powered-down and then powered-up, in order to clear the overload fault and drive the audio output. Examples of conventional class D audio power amplifiers with overload or overcurrent protection are described in Brotton, "Sound advice for Class D amplifiers", *EDN* (Apr. 28, 2005), pp. 65 through 70; and in Berkhout, "Integrated Overcurrent Protection for Class D Power Stages", 29$^{th}$ *European Solid-State Circuits Conference: ESSCIRC* 2003 (September 2003), Paper C30.2.

It has been observed, however, that the dynamic impedance that modern typical loudspeakers present to output amplifiers can inadvertently trip the overcurrent protection of conventional digital audio amplifiers, shutting down the amplifier system and requiring a reset by the user, even though a dangerous short circuit condition was not in fact present. This is of course undesirable, and extremely annoying to the user of the system. As a result, conventional power amplifiers are typically designed to have extremely high output current margins relative to the current that is actually required to drive the nominal resistive load of the loudspeakers to full power. In other words, the dynamic impedance presented by modern loudspeakers when playing rapidly changing audio content is often sufficient to trip the overcurrent protection system inadvertently, unless the overcurrent protection system is greatly overdesigned. Of course, overdesign of the audio amplifier to provide accurate overload protection increases the cost of the audio amplifier.

Other conventional digital audio amplifier systems address this problem by providing an auto-recovery function, by way of which the output power stages automatically reset at a selected time after tripping off due to overload. Examples of conventional audio amplifier devices providing this functionality include the TDA8920B class-D power amplifier announced by Philips Electronics N.V., and the TK2150 digital audio amplifier driver announced by Tripath Technology, Inc. While such auto-recovery functionality keeps the audio content playing despite overload trips resulting from dynamic overload, the resulting audio output is very unpleasant.

By way of further background, the use of cycle-by-cycle overload protection as applied to switching power supplies is known in the art, an example of which is described in U.S. Pat. No. 5,892,665.

BRIEF SUMMARY OF THE INVENTION

It is therefore an object of this invention to provide a digital audio amplifier in which output overload and overcurrent protection can be provided without being audible to the listener.

It is a further object of this invention to provide such an amplifier that can be manufactured at substantially reduced cost by providing such operation with the overload and overcurrent limits set close to actual operating condition.

Other objects and advantages of this invention will be apparent to those of ordinary skill in the art having reference to the following specification together with its drawings.

The present invention may be implemented into a digital audio amplifier in which the detection of an overload condition at an amplifier output causes shutdown of the output amplifier, followed by reset and restarting of that amplifier at the next pulse-width-modulation cycle or frame.

According to another aspect of the invention, pulse-width-modulation cycles having overload faults are counted, and compared with pulse-width-modulation cycles that do not have overload faults. System shutdown is then effected if the number of overload cycles exceeds a selected fraction of the total operating cycles.

According to another aspect of the invention, an output current detector monitors the amplifier output current, relative to a dynamically changing overcurrent threshold level, to determine whether an overload condition exists. The overcurrent threshold level can vary with the particular operating state of the amplifier, such as at startup or shutdown, and thus prevent clicks and pops during such transition times. In another implementation, the overcurrent threshold level can modulate with the relative number of PWM cycles causing overloads, so that the overcurrent threshold level ramps down if overload cycles are frequent, and ramps back up as overload cycles become less frequent.

DETAILED DESCRIPTION OF THE INVENTION

The present invention will be described in connection with its preferred embodiment, namely as implemented into a digital audio receiver system because it is contemplated that the benefits of this invention will be especially valuable in such an application. However, it is also contemplated that this invention can be used to advantage in other applications, particularly those that include switching power amplifiers, and especially switching power amplifiers that drive audio output signals. Accordingly, it is to be understood that the following description is provided by way of example only, and is not intended to limit the true scope of this invention.

Figure 1:
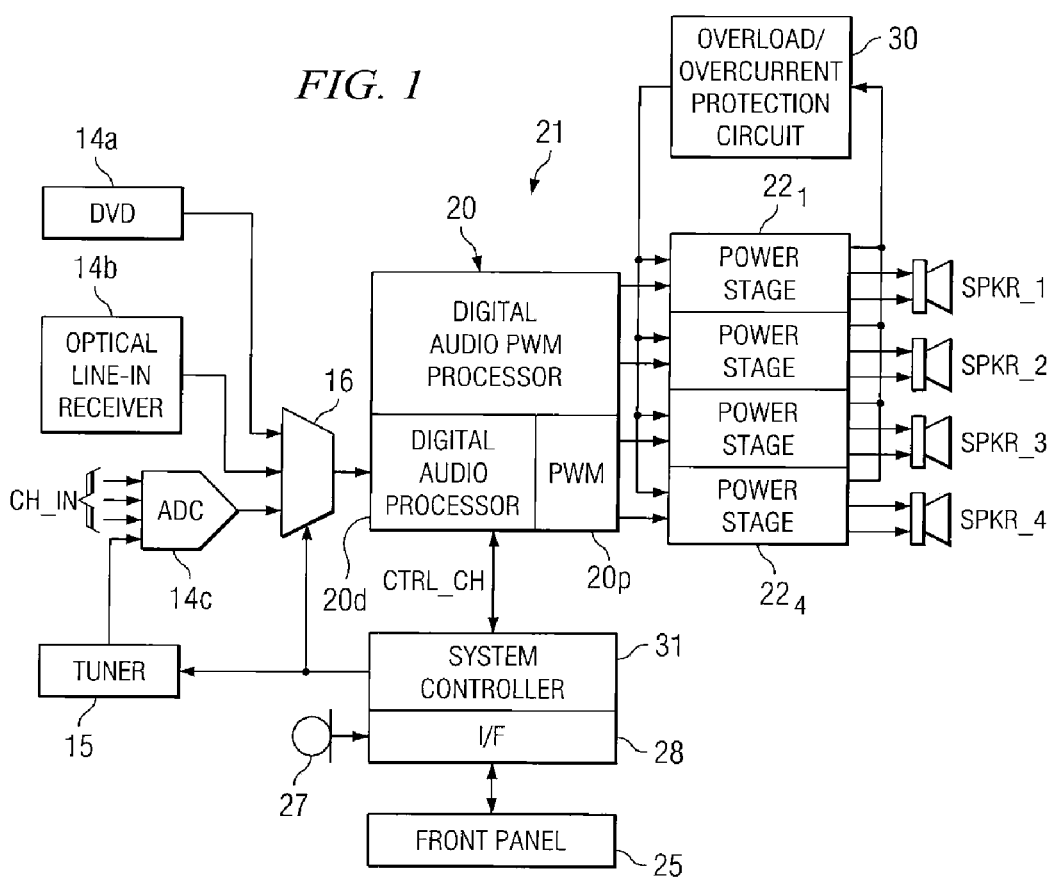
FIG. 1 is an electrical diagram, in block form, of a digital audio receiver constructed according to the preferred embodiment of the invention.

Referring now to FIG. 1, the construction of audio processing circuitry in digital audio-visual receiver 21 according to the preferred embodiment of the invention will now be described. The video data paths in digital audio-visual receiver 21 are not shown, for the sake of clarity in this description. In the example of receiver 21, multiple sources of audio signals are available to receiver 21, and may be processed into output audio by digital audio decoder and processor 20. Multiplexer 16 receives digital audio from DVD controller 14a, such audio corresponding to audio content from DVD movies, or audio contents from a CD, either being played on a DVD player (not shown) to which receiver 21 is connected. Optical line-in receiver 14b provides digital audio, for example from satellite or cable television sources, to another input of multiplexer 16. Analog-to-digital converter (ADC) 14c converts analog stereo signals from analog line-in inputs CH_IN and from tuner 15 to a digital datastream, and provides this datastream to another input input of multiplexer 16. Multiplexer 16 chooses from among these inputs, and inputs from other sources if available, for application to digital audio PWM processor 20, under the control of system controller 31. The selection of audio source effected by multiplexer 16 is under user control; in this regard, system controller receives direct selection inputs from front panel switches 25 of receiver 21, or infrared remote control signals via infrared receiver 27, both communicating with system controller 31 via interface circuitry 28.

In a general sense, digital audio PWM processor 20 includes digital audio processing function 20d and pulse-width-modulation (PWM) function 20p. In general, digital audio processing function 20d digitally processes digital audio signals according to a sequence of functions including digital mixing, channel equalization, treble and bass control, soft volume, loudness compensation, dynamic range compensation, and the like. As mentioned above, and as will be described in further detail below, these digital audio processing operations are typically executed by way of digital filters. The output of digital audio processor 20d is forwarded to PWM function 20p, for example in the form of pulse-code-modulated (PCM) digital words. PWM function 20d converts the PCM digital audio signals at its inputs to corresponding pulse-width-modulated (PWM) output signals. In this example, PWM processor 20p produces, for each of the four supported channels, separate PWM control signals that are applied to a corresponding power stage $22_1$ through $22_4$, each of which drives a respective one of loudspeakers SPKR_1 through SPKR_4. Of course, more or fewer audio channels may be driven by receiver 21. In a simple stereo arrangement, only two channels may be processed; alternatively, as many as eight audio channels are now commonly handled by audio-visual receivers such as receiver 21. The number of channels supported and utilized by receiver 21 is a matter of choice for the designer and the user.

According to this embodiment of the invention, digital audio PWM processor 20, including both of the functions of digital audio processor 20d and PWM function 20p, along with the appropriate support controller and other circuitry, is preferably realized in a single integrated circuit. Alternatively, the two functions of digital audio processor 20d and PWM function 20p may be realized in separate integrated circuits from one another. In either case, it is contemplated that those skilled in the art, having reference to this specification including the detailed description of the construction and operation of digital audio PWM processor 20 provided below, will be able to realize this invention in a suitable manner for a specific application, without undue experimentation.

As mentioned above, system controller 31 provides audio source selection signals to multiplexer 16. In addition, system controller 31 provides channel volume control signals to PWM function 20p in digital audio PWM processor 20, and provides other control signals throughout receiver 21, including channel selection control to tuner 15 in response to user inputs received via front panel 25 or infrared receiver 27. Control signals or data are provided by system controller 31 to digital audio PWM processor 20, for example over control channel CTRL_CH, in the conventional manner.

Figure 2:
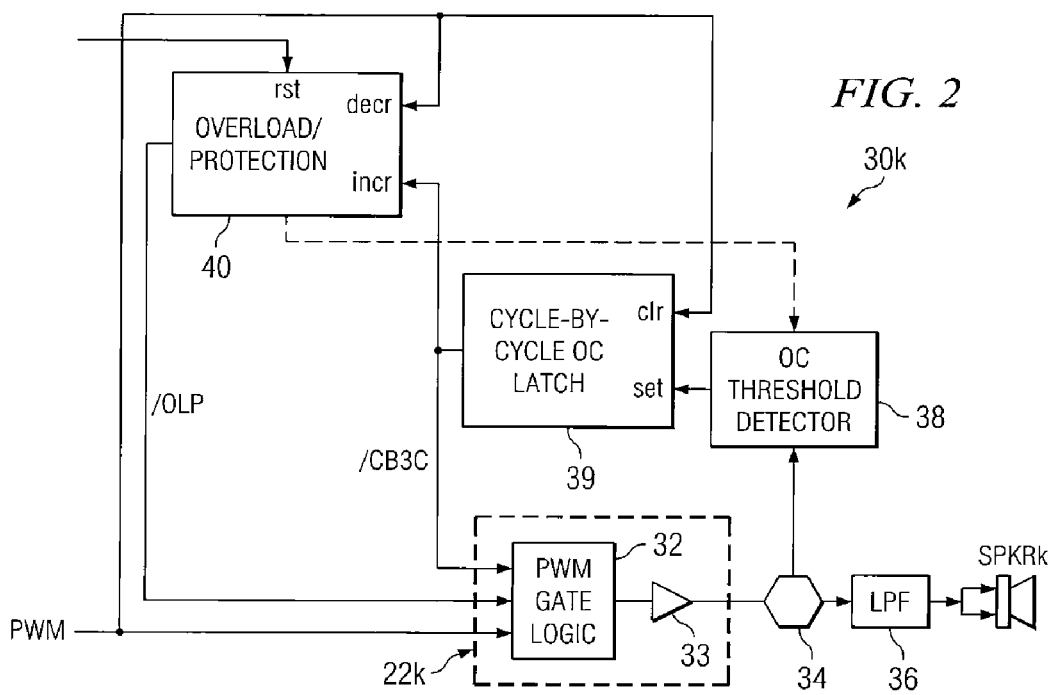
FIG. 2 is an electrical diagram, in block form, of overload and overcurrent protection circuitry in the digital audio receiver constructed according to the preferred embodiment of the invention.

Referring now to FIG. 2, the construction of overcurrent and overload protection circuitry 30 according to the preferred embodiment of the invention will now be described. In the example of FIG. 2, overcurrent and overload protection circuitry 30 is operating in cooperation with power stage 22k for one of the multiple channels supported by system 21. It is understood that similar circuitry will be provided with each of the multiple channels; it is also contemplated that the multiple channels may share some or all of overcurrent and overload protection circuitry 30.

As shown in FIG. 2, PWM gate logic 32 receives the PWM control signal for this channel from digital audio PWM processor 20, in combination with control signals on lines/CB3C and /OLP from overcurrent and overload protection circuit 30, as will be described below. In normal operation, PWM gate logic 32 is enabled (by lines /CB3C and /OLP both asserted high, in this example) to pass the PWM control signal to amplifier 33 which, in turn, generates the output signal applied via low-pass filter 36 to speaker SPKRk for this channel. Amplifier 33 may be arranged in any one of a number of known arrangements for digital power stage amplifiers, including the conventional H-bridge arrangement of complementary MOS or bootstrapped n-channel MOS transistors, or as a single-ended output driver.

Connected in series between amplifier 33 and low-pass filter 36 in this embodiment of the invention is current sensing circuit 34, which may be implemented as a series resistor with sensing circuitry or in other conventional implementations, as known in the art. Examples of conventional current sensing circuits suitable for use as current sensing circuit 34 according to the preferred embodiment of the invention are described in Brotton, "Sound advice for Class D amplifiers", *EDN* (Apr. 28, 2005), pp. 65 through 70; and in Berkhout, "Integrated Overcurrent Protection for Class D Power Stages", 29$^{th}$ *European Solid-State Circuits Conference: ESSCIRC* 2003 (September 2003), Paper C30.2.

Overcurrent threshold detector 38 receives a measure of the sensed output current, for example as a voltage across a series sense resistor, and compares the sensed output current measure against a threshold level to detect whether an overcurrent condition is present at the output of amplifier 33. The threshold level may be a static, or fixed, threshold level, for example as set by way of an external resistor or resistor network, or established in the manufacture of the circuit. Alternatively, the threshold level used by overcurrent threshold detector 38 may be a dynamic value that changes according to the operating mode of receiver 21, for example under the control of system controller 31 or other control circuitry. According to one preferred embodiment of the invention, system controller 31 may control overcurrent threshold detector 38 to apply lower overcurrent thresholds during startup and shutdown of receiver 21. For example, the overcurrent threshold applied by detector 38 can ramp from a low value to its full, normal operating, level as receiver 21 starts up, effectively providing a smooth ramp down in output impedance (from disabled, "high-Z", output state to its full low output impedance state). A similar ramp up in output impedance (i.e., ramp down of the overcurrent threshold) can be applied during shutdown. It is in fact contemplated, in connection with this invention, that this ramping of the overcurrent threshold level applied by overcurrent threshold detector 38 can be effective to eliminate audible "clicks" and "pops" in the output audio signal that are often encountered in startup and shutdown; this approach is quite simple to implement as compared with many conventional click and pop reduction techniques.

The output of overcurrent threshold detector 38 is applied to the set input of cycle-by-cycle overcurrent latch 39. Latch 39 generates an output signal on line /CB3C to PWM gate logic 32, in this embodiment of the invention. In this example, an asserted state from overcurrent threshold detector 38 sets latch 39, which in turn asserts a logic level low (the "/" indicator on line /CB3C indicating active low) on line /CB3C to PWM gate logic 32, blocking transitions on input line PWM from passing through to amplifier 33. In addition, the output of latch 39 on line /CB3C is also applied to an increment input of overload protection circuit 40.

The input line PWM is connected both to PWM gate logic 32, and also to the clear input of latch 39. If latch 39 has been set by a overcurrent condition at the output of amplifier 33, the end of that cycle or "frame" of PWM signals will cause a transition of input line PWM, which is interpreted by latch 39 as a reset pulse, clearing the state of latch 39 and causing line /CB3C to be taken inactive (e.g., a high level in this example). This enables PWM gate logic 32 to again pass PWM control signals from PWM audio processor 20, as described above.

Figure 3:
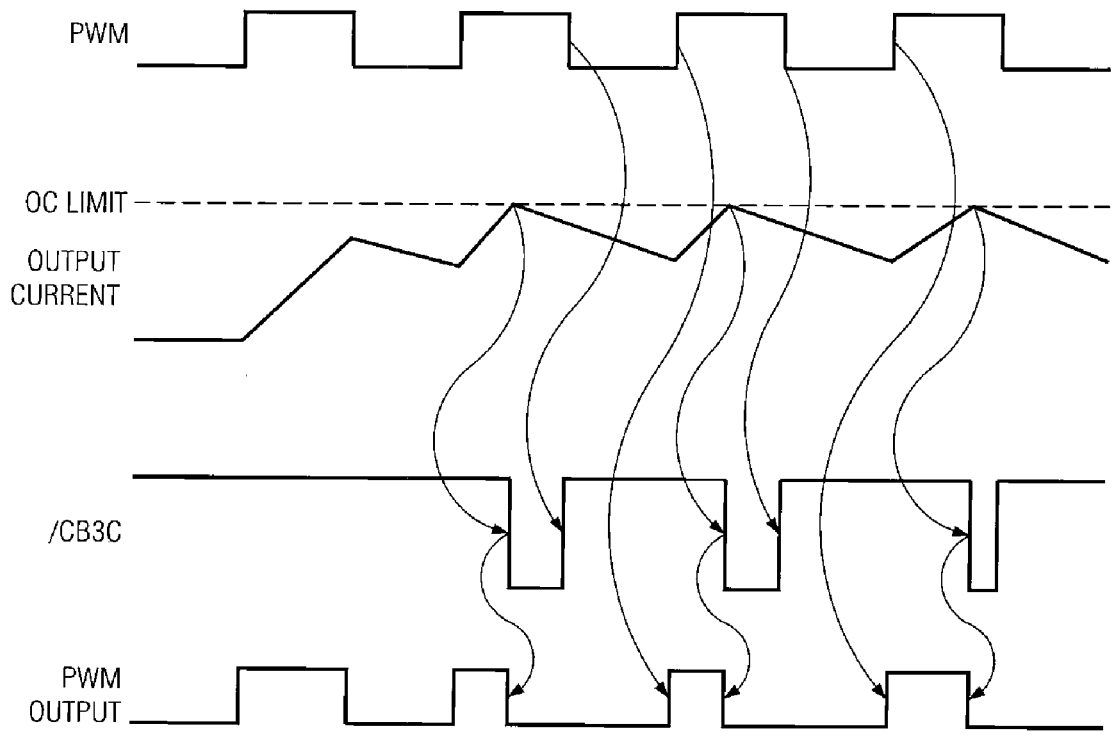
FIG. 3 is a timing diagram illustrating the operation of cycle-by-cycle overcurrent protection effected by the circuit of FIG. 2 according to the preferred embodiment of the invention.

The operation of overcurrent and overload protection circuit 30 according to the preferred embodiment of the invention will now be described relative to FIG. 3. In the example of FIG. 3, the PWM signal on input line PWM illustrates the duty cycle of the audio output signal. This PWM signal is applied to amplifier 33, which generates an output current via amplifier 33 at increasing levels from cycle to cycle. In the second PWM cycle shown in FIG. 3, the output current (line OUTPUT CURRENT) generated by amplifier 33 reaches the overcurrent limit or threshold (line OC LIMIT), as applied by overcurrent threshold detector 38. As a result, overcurrent threshold detector 38 issues a set signal to latch 39, which in turn asserts a low level on line /CB3C as shown in FIG. 3. The low level on line /CB3C in turn blocks the PWM input signal at PWM gate logic 32, stopping the PWM output from amplifier 33 as shown on line PWM OUTPUT in FIG. 3. The duty cycle of the PWM output signal is thus reduced from what it would normally be (i.e., the same duty cycle as shown by input line PWM).

Upon the next falling edge of the PWM control signal on input line PWM at the end of the current PWM cycle, latch 39 is cleared, pulling line /CB3C high again as shown. PWM output is then again enabled, and begins again in the next PWM cycle (or frame). Alternatively, latch 39 may be cleared by the rising edge of the PWM input cycle at the beginning of the next cycle. However, in this example, the next cycle also causes an overcurrent condition (as shown), as detected by overcurrent threshold detector 38 which sets latch 39 accordingly. Line /CB3C is again pulled low, until the end of the PWM frame as shown in FIG. 3. This operation continues from cycle to cycle in this manner.

As a result of this invention, therefore, overcurrent protection for a PWM audio system is provided in a manner that does not require either a hard reset or a long auto-recover time, as is necessary in conventional PWM digital audio systems. Rather, by clearing the overcurrent condition prior to or at the next PWM frame, or cycle, excellent output protection is provided while also minimizing the audible interruptions if the overcurrent threshold is reached.

It has been observed, according to this invention, that an overload condition present at the channel output would cause a large fraction of PWM cycles to raise overcurrent events. This overload condition is preferably managed differently than the cycle-by-cycle approach for transient overcurrent events described above. According to the preferred embodiment of the invention shown in FIG. 2, overcurrent and overload protection circuit 30 includes overload protection circuit 40, which maintains a running measure of the number of PWM cycles with an overcurrent condition relative to PWM cycles that are not overcurrent faults. In this implementation, overload protection circuit 40 has an increment input that receives the state of line /CB3C from latch 39, and a decrement input that receives input line PWM. Overload protection circuit 40 generates an active low signal on line /OLP in response to the frequency of overcurrent cycles exceeding a preselected threshold or set point.

Figure 4:
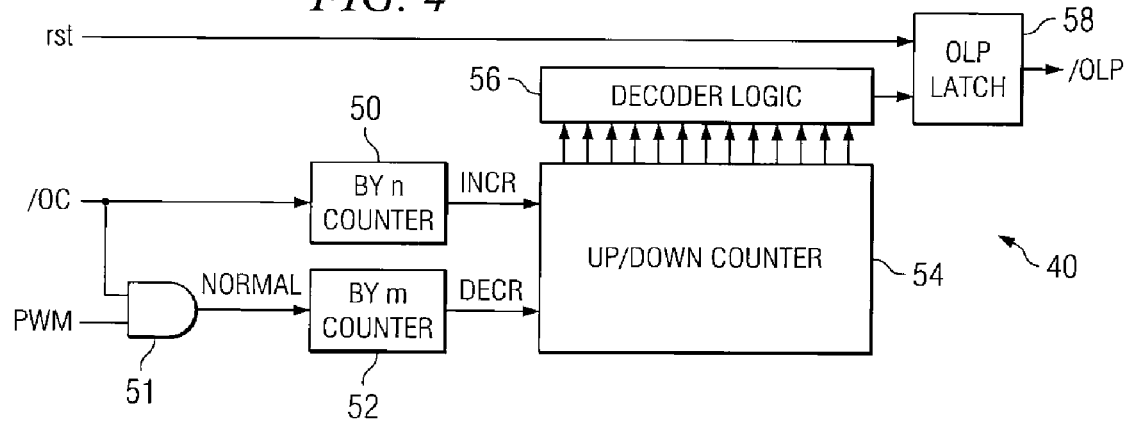
FIG. 4 is an electrical diagram, in block form, of overload protection circuitry in the overload and overcurrent protection circuitry in the digital audio receiver constructed according to the preferred embodiment of the invention.

In one exemplary implementation, overload protection circuit 40 is implemented as a digital circuit, as shown in FIG. 4. First counter 50 receives an input signal /OC that is generated in response to the detection of a PWM cycle in which an overcurrent event occurs, and in response to that signal /OC, advances its count. The signal on line /OC may be generated in response to a transition on line/CB3C of FIG. 2, or may actually equate to line/CB3C as shown in FIG. 2. Upon reaching a selected or programmed value n, indicating that n such overcurrent cycles have been detected, counter 50 generates an increment signal at its output, which is applied to the increment input of up/down counter 54. Conversely, second counter 52 receives an input signal NORMAL, which is driven active upon each PWM cycle in which no overcurrent event occurs. For example, logic 51 may be provided to generate signal NORMAL responsive to signal PWM indicating a PWM cycle in the absence of an overcurrent signal on line/OC. Counter 52 advances in response to each active signal NORMAL, and upon counting up to a selected or programmed value m, applies before a decrement signal to the decrement input of up/down counter 54. The contents of up/down counter 54 are decoded by decoder logic 56, which applies a set signal to output latch 58, which in turn drives line/OLP active (when set). Signal RESET is externally applied to OLP latch 58, to reset latch 58 and return line/OLP with to an inactive state.

Accordingly, up/down counter 54 and decoder logic 56 determine whether the number of overcurrent cycles detected by circuit 30 is sufficiently high, relative to the number normal cycles. Considering the construction of overload protection circuit 40 described above, this comparison is carried out by up/down counter 54 maintaining a count corresponding to the number of overcurrent cycles (divided by n) relative to the number of normal cycles (divided by m); when this relative count reaches a threshold level implemented in and determined by decoder logic 56, latch 58 in overload protection circuit 40 asserts a low logic level on line/OLP, which "permanently" turns off the output drive circuitry, by way of PWM gate logic 32 of FIG. 2. This action ensures that circuit 30 properly protects the circuitry in a true overload event. A hard reset of receiver 21, or power-down/power-up operation will then clear the overload state of latch 58 (by asserting line rst) to permit normal audio PWM output operation again (assuming that the cause of the overload is removed).

According to another embodiment of the invention, or in combination with the dynamic variation of the overcurrent threshold with startup and shutdown operations, the overcurrent threshold level can vary according to the frequency with which overcurrent conditions are detected. As shown in FIG. 2, a control line from logic in overload protection circuit 40 can be optionally applied to overcurrent threshold detector 38, so that the overcurrent threshold can be lowered if overcurrent conditions are frequently encountered, and raised if overcurrent conditions are seldom detected. To accomplish this function, decoder logic 56 can include a second threshold level or multiple levels, against which the contents of up/down decoder 54 can be decoded to select the desired overcurrent threshold level, if desired.

Figure 5:
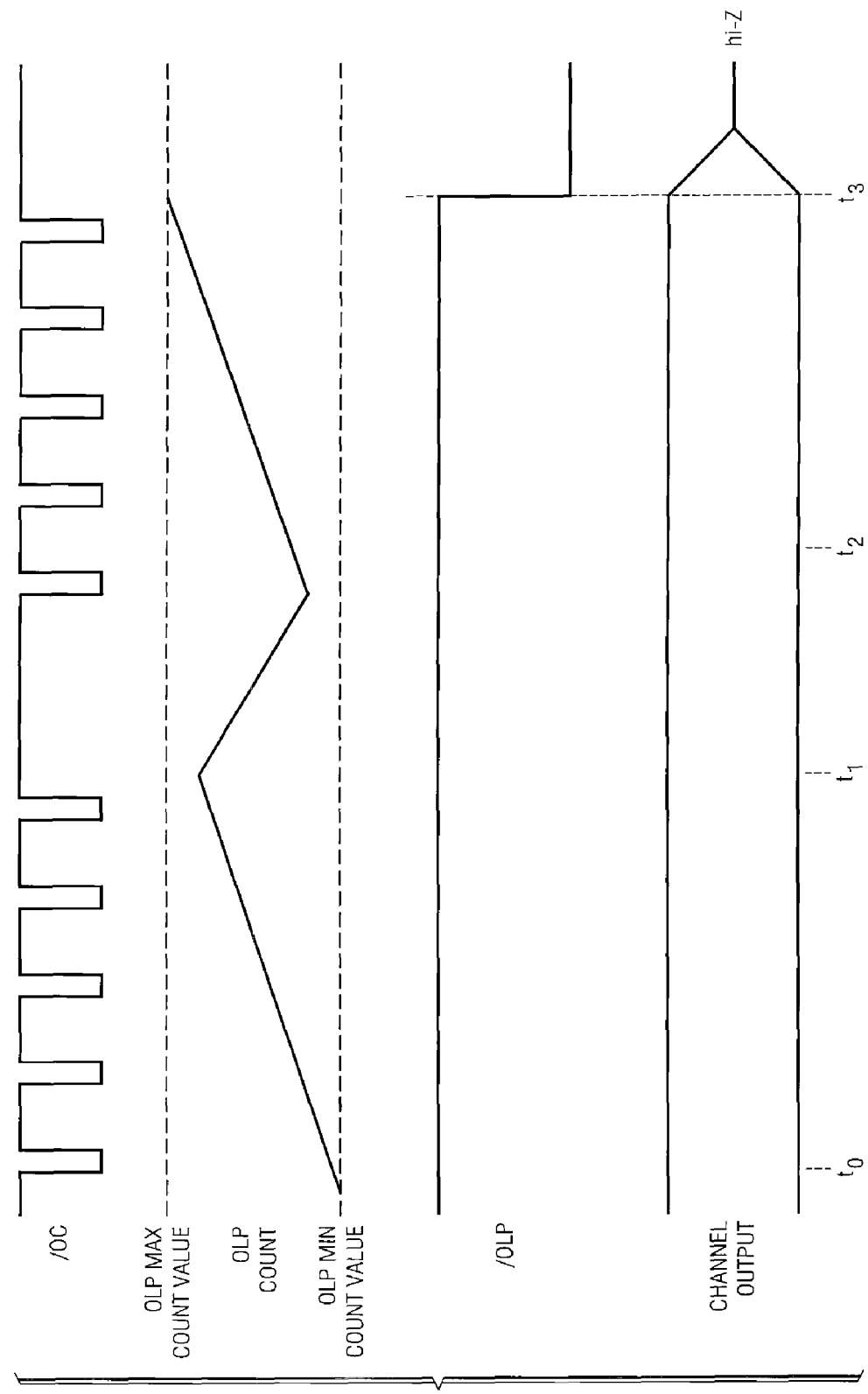
FIG. 5 is a timing diagram illustrating the operation of the overload protection circuitry of FIG. 4 according to the preferred embodiment of the invention.

FIG. 5 illustrates the operation of overload protection circuit 40 in counting up overcurrent effects, according to the preferred embodiment of the invention. In the example of FIG. 5, the impedance of the load (i.e., speaker SPKRk in FIG. 2) is very low, such as in the case of a speaker fault or other short-circuit-causing factor. As such, beginning with time to in FIG. 5, overcurrent cycles are frequently detected, as shown by the repeated transitions on line/OC. Each transition on line/OC (corresponding to a PWM cycle in which line/CB3C is driven active, as shown in FIG. 2) increments counter 50 in overload protection circuit 40 (FIG. 4) toward its value n, upon which counter 50 advances the contents of up/down counter 54 after each group of n overcurrent cycles. In the example of FIG. 5, the contents of up/down counter 54 are illustrated by line OLP COUNT. In actual practice, line OLP COUNT will remain at a given value for each n overcurrent cycles, following which the value would advance by one; for the sake of clarity, the counting up by n is not illustrated in FIG. 5, but rather line OLP COUNT is simply shown as smoothly increasing during this repeated overcurrent time period.

At time $t_1$ in the example shown in FIG. 5, the low impedance condition either temporarily resolves itself or the PWM input levels are quieted, so that several "normal" cycles without overcurrent conditions occur in sequence. As described above relative to FIG. 4, these cycles cause counter 52 to increment its contents; after each group of m such normal cycles, counter 52 decrements the contents of up/down counter 54. As such, in the example of FIG. 5, the contents of up/down counter 54 decrease between time $t_1$ and time $t_2$.

But at time $t_2$ in the example of FIG. 5, overcurrent faults begin happening again. Counter 50 is again incremented with each overcurrent cycle, eventually incrementing the contents of up/down counter 54 (line OLP COUNT) with each group of n overcurrent cycles. At time $t_3$, decoder logic 56 senses the contents of up/down counter 54 have reached an overload, or shutdown, threshold (shown as "OLP max count value" in FIG. 5). In response to this state, decoder logic 56 then sets output latch 59, which drives line/OLP active low. PWM gate logic 32 for this channel then turns off the output drive for the channel, resulting in a high-impedance output state driven for this channel (line CHNL OUTPUT in FIG. 5). The overloaded channel is thus safely shut down.

The relative values of m and n applied to counters 50, 52, respectively, can vary depending upon the desired sensitivity of overload protection circuit 40. Indeed, it is contemplated that in certain operating modes in which overcurrent cycles due to the audio content are expected, overload protection circuit 40 can be made less sensitive (by increasing the value n and decreasing the value m) to avoid undesired overload shutdown. Conversely, in a mode in which overcurrent cycles due to audio content are expected to be rare, overload protection circuit 40 can be made more sensitive to ensure rapid and safe shutdown in response to only a few overcurrent cycles, which would tend to indicate a true overload condition. This setting of the values n, m in these modes can be effected by system controller 31 in response to user inputs, or by other control circuitry.

Alternatively, overload protection circuit 40 can be implemented in an analog realization, for example by charging and discharging a capacitor circuit in response to the increment and decrement signals applied to overload protection circuit 40. In this analog realization, the charge and discharge time constants, also known as "attack" and "decay", correspond to the n and m values of the digital realization described above. A voltage threshold detector can monitor the voltage across the capacitor and issue the overload signal on line/OLP if the number of overcurrent cycles is excessive.

According to the preferred embodiment of this invention, therefore, important advantages in the control of modern audio output systems are provided. This invention provides the ability of the audio power output circuitry to closely sense overcurrent conditions and safely avoid catastrophic failure, while still permitting rapid recovery, preferably on a cycle-by-cycle basis. This control enables overcurrent situations due to rapidly changing audio output (i.e., data-dependent overcurrent) to be handled without requiring a hard reset or other audible interruption of the audio output. According to other aspects of this invention, overload protection is also provided, so that the output drive can be disabled in the event of a true overload condition, determined by a high frequency of overcurrent cycles. This construction relieves the designer from over-specifying the current drive capability of the output power circuitry merely to handle transient and dynamic overcurrent conditions, thus reducing the cost and complexity of the audio output circuitry, but with no loss of protection against true overload conditions. Furthermore, this invention enables dynamic adjustment of the overcurrent and overload threshold determinations, such as during startup and shutdown, or depending on expected operating conditions.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention.

What is claimed is:

1. Power output circuitry for a digital audio system, comprising:

PWM gate logic for receiving an audio channel pulse-width-modulated control signal;

a power amplifier having an input coupled to receive the pulse-width-modulated control signal from the PWM gate logic and having an output for providing current for driving a load;

a current sensing circuit, coupled to the output of the power amplifier, for sensing current driven from the power amplifier to the load;

an overcurrent threshold detector, having an input coupled to the current sensing circuit and having an output, for comparing the sensed current to an overcurrent threshold;

an overcurrent latch, having a set input coupled to the output of the overcurrent threshold detector, having a clear input coupled to the pulse-width-modulated control signal, and having an output coupled to the PWM gate logic, for generating a blocking signal to block the receipt of the pulse-width-modulated control signal by the power amplifier from the PWM gate logic responsive to the sensed current reaching the overcurrent threshold within a cycle of the pulse-width-modulated control signal, and for clearing the blocking signal for a next cycle of the pulse-width-modulated control signal; and overload protection circuitry, having an input coupled to the output of the overcurrent latch, for presenting an overload shutdown signal to the PWM gate logic, responsive to the frequency of cycles of the pulse-width-modulated control signal in which the sensed current reaches the overcurrent threshold, wherein the overload protection circuitry presents the overload shutdown signal responsive to a comparison of a count of cycles of the pulse-width-modulated control signal in which the sensed current reaches the overcurrent threshold to a count of cycles of the pulse-width-modulated control signal in which the sensed current does not reach the overcurrent threshold, and wherein the overload protection circuitry includes:

a first counter, having an input coupled to the overcurrent threshold detector, for counting cycles of the pulse-width-modulated control signal in which the sensed current reaches the overcurrent threshold;

a second counter, for counting cycles of the pulse-width-modulated control signal in which the sensed current does not reach the overcurrent threshold;

an up/down counter, for advancing its contents responsive to the first counter reaching a first selected value, and for decrementing its contents responsive to the second counter reaching a second selected value; and decoder logic, for generating the overload shutdown signal responsive to the contents of the up/down counter reaching a selected shutdown value.

2. The circuitry of claim 1, wherein the overcurrent threshold has a fixed threshold value.

3. The circuitry of claim 1, further comprising control circuitry, coupled to the overcurrent threshold detector, for dynamically controlling the overcurrent threshold.

4. The circuitry of claim 1, wherein the overload protection circuitry further comprises threshold decoder logic, having an output coupled to the overcurrent threshold detector, for generating a value of the overcurrent threshold responsive to the contents of the up/down counter.

5. The circuitry of claim 1, further comprising control circuitry for setting the first and second selected values in the first and second counters, respectively.

6. A method of overcurrent protection for an audio system power output stage including a power amplifier for driving a load responsive to a pulse-width-modulated control input signal, comprising:

sensing output current driven from the power amplifier to the load;

responsive to sensing output current reaching an overcurrent threshold value in a cycle of the pulse-width-modulated control signal, blocking the pulse-width-modulated control signal from input to the power output stage amplifier;

for a next cycle of the pulse-width-modulated control signal, enabling the pulse-width-modulated control signal input to the power amplifier;

monitoring a frequency of cycles of the pulse-width-modulated control signal in which the sensed output current reaches the overcurrent threshold value, relative to cycles of the pulse-width-modulated control signal in which the sensed output current does not reach the overcurrent threshold value, wherein the step of monitoring further includes the sub-steps of:

counting a first number of cycles corresponding to cycles of the pulse-width-modulated control signal in which the sensed output current reaches the overcurrent threshold value;

counting a second number of cycles corresponding to cycles of the pulse-width-modulated control signal in which the sensed output current does not reach the overcurrent threshold value;

generating an overload signal responsive to a comparison of the first and second numbers of cycles by:

advancing contents of an up/down counter responsive to the first number of cycles reaching a first selected value;

decreasing the contents of the up/down counter responsive to the second number of cycles reaching a second selected value; and decoding the contents of the up/down counter relative to an overload limit;

responsive to the frequency reaching an overload limit, blocking the pulse-width-modulated control signal from the power amplifier.

7. The method of claim 6, wherein the blocking step comprises setting an overcurrent latch, the overcurrent latch having an output coupled to a gating input of PWM gate logic; and wherein the enabling step comprises: clearing the overcurrent latch.

8. The method of claim 7, wherein the clearing step comprises clearing the overcurrent latch responsive to the end of the cycle of the pulse-width-modulated control signal.

9. The method of claim 7, wherein the clearing step comprises clearing the overcurrent latch responsive to the beginning of the next cycle of the pulse-width-modulated control signal.

10. The method of claim 6, further comprising following startup of the audio system, increasing the overcurrent threshold value.

11. The method of claim 6, further comprising, prior to shutdown of the audio system, decreasing the overcurrent threshold value.

12. The method of claim 6, further comprising enabling the pulse-width-modulated control signal by resetting the audio system.

13. The method of claim 6, further comprising deriving a value of the overcurrent threshold responsive to the contents of the up/down counter.

14. A digital audio system, comprising:
- a digital audio PWM processor, for receiving a digital input audio signal and for generating pulse-width-modulated control signals for at least one output channel responsive thereto;
- a power output stage for each output channel, comprising PWM gate logic for receiving the pulse-width-modulated control signals from the digital audio PWM processor, and a power amplifier having an input coupled to an output of the PWM gate logic and an output
- a speaker for each output channel, driven by the power amplifier for that output channel; and overcurrent protection circuitry, coupled to at least one of the power output stages, including:
  - a current sensing circuit, coupled to the output of the power amplifier, for sensing current driven from the power amplifier;
  - an overcurrent threshold detector, having an input coupled to the current sensing circuit and having an output, for comparing the sensed current to an overcurrent threshold; and
  - an overcurrent latch, having a set input coupled to the output of the overcurrent threshold detector, having a clear input coupled to the pulse-width-modulated control signal, and having an output coupled to the PWM gate logic, for generating a blocking signal to block the receipt of the pulse-width-modulated control signal by the power amplifier from the PWM gate logic responsive to the sensed current reaching the overcurrent threshold within a cycle of the pulse-width-modulated control signal, and for clearing the blocking signal for a next cycle of the pulse-width-modulated control signal; and
  - overload protection circuitry, having an input coupled to the output of the overcurrent latch, for presenting an overload shutdown signal to the PWM gate logic, responsive to the frequency of cycles of the pulse-width-modulated control signal in which the sensed current reaches the overcurrent threshold, wherein the overload protection circuitry presents the overload shutdown signal responsive to a comparison of a count of cycles of the pulse-width-modulated control signal in which the sensed current reaches the overcurrent threshold to a count of cycles of the pulse-width-modulated control signal in which the sensed current does not reach the overcurrent threshold, and wherein the overload protection circuitry includes:
    - a first counter, having an input coupled to the overcurrent threshold detector, for counting cycles of the pulse-width-modulated control signal in which the sensed current reaches the overcurrent threshold;
    - a second counter, for counting cycles of the pulse-width-modulated control signal in which the sensed current does not reach the overcurrent threshold;
    - an up/down counter, for advancing its contents responsive to the first counter reaching a first selected value, and for decrementing its contents responsive to the second counter reaching a second selected value; and
    - decoder logic, for generating the overload shutdown signal responsive to the contents of the up/down counter reaching a selected shutdown value.

15. The system of claim 14, wherein the overcurrent threshold has a fixed threshold value.

16. The system of claim 14, further comprising control circuitry, coupled to the overcurrent threshold detector, for dynamically controlling the overcurrent threshold.

17. The system of claim 16, wherein the control circuitry increases the overcurrent threshold during startup of the system.

18. The system of claim 16, wherein the control circuitry decreases the overcurrent threshold during shutdown of the system.

19. The system of claim 14, wherein the overload protection circuitry further comprises threshold decoder logic, having an output coupled to the overcurrent threshold detector, for generating a value of the overcurrent threshold responsive to the contents of the up/down counter.

20. The system of claim 14, further comprising control circuitry for setting the first and second selected values in the first and second counters, respectively.

\* \* \* \* \*